United States Patent
Fujino

(10) Patent No.: US 12,283,337 B2
(45) Date of Patent: Apr. 22, 2025

(54) SENSE AMPLIFIER WITH REDUCED VOLTAGE OFFSET

(71) Applicant: Taiwan Semiconductor Manufacturing Company, Ltd., Hsinchu (TW)

(72) Inventor: Yorinobu Fujino, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 547 days.

(21) Appl. No.: 17/587,163

(22) Filed: Jan. 28, 2022

(65) Prior Publication Data

US 2023/0037885 A1 Feb. 9, 2023

Related U.S. Application Data

(60) Provisional application No. 63/230,518, filed on Aug. 6, 2021.

(51) Int. Cl.
*G11C 7/06* (2006.01)
*G11C 7/12* (2006.01)
*G11C 7/22* (2006.01)

(52) U.S. Cl.
CPC ............... *G11C 7/062* (2013.01); *G11C 7/12* (2013.01); *G11C 7/22* (2013.01)

(58) Field of Classification Search
CPC .............. G11C 7/062; G11C 7/12; G11C 7/22
USPC ............................................................ 365/207
See application file for complete search history.

(56) References Cited

U.S. PATENT DOCUMENTS

| | | | |
|---|---|---|---|
| 9,608,827 B1* | 3/2017 | Trimberger | G11C 7/12 |
| 2008/0037338 A1* | 2/2008 | Chen | G11C 7/14 |
| | | | 365/194 |
| 2017/0053695 A1* | 2/2017 | Sonkar | G11C 11/413 |
| 2019/0214076 A1* | 7/2019 | Shankar | G11C 7/1042 |

* cited by examiner

*Primary Examiner* — Connie C Yoha
(74) *Attorney, Agent, or Firm* — FOLEY & LARDNER LLP

(57) ABSTRACT

Disclosed herein is a sense amplifier. In one aspect, the sense amplifier includes a first pair of cross-coupled transistors and a second pair of cross-coupled transistors coupled to a first port and a second port of the sense amplifier. In one aspect, the sense amplifier includes a first access transistor coupled between a first input line and the first port. In one aspect, the sense amplifier includes a second access transistor coupled between a second input line and the second port. In one aspect, the first pair of cross-coupled transistors includes a first transistor and a second transistor cross-coupled with each other. In one aspect, a source electrode of the first transistor is directly coupled to the first input line, and a source electrode of the second transistor is directly coupled to the second input line.

20 Claims, 10 Drawing Sheets

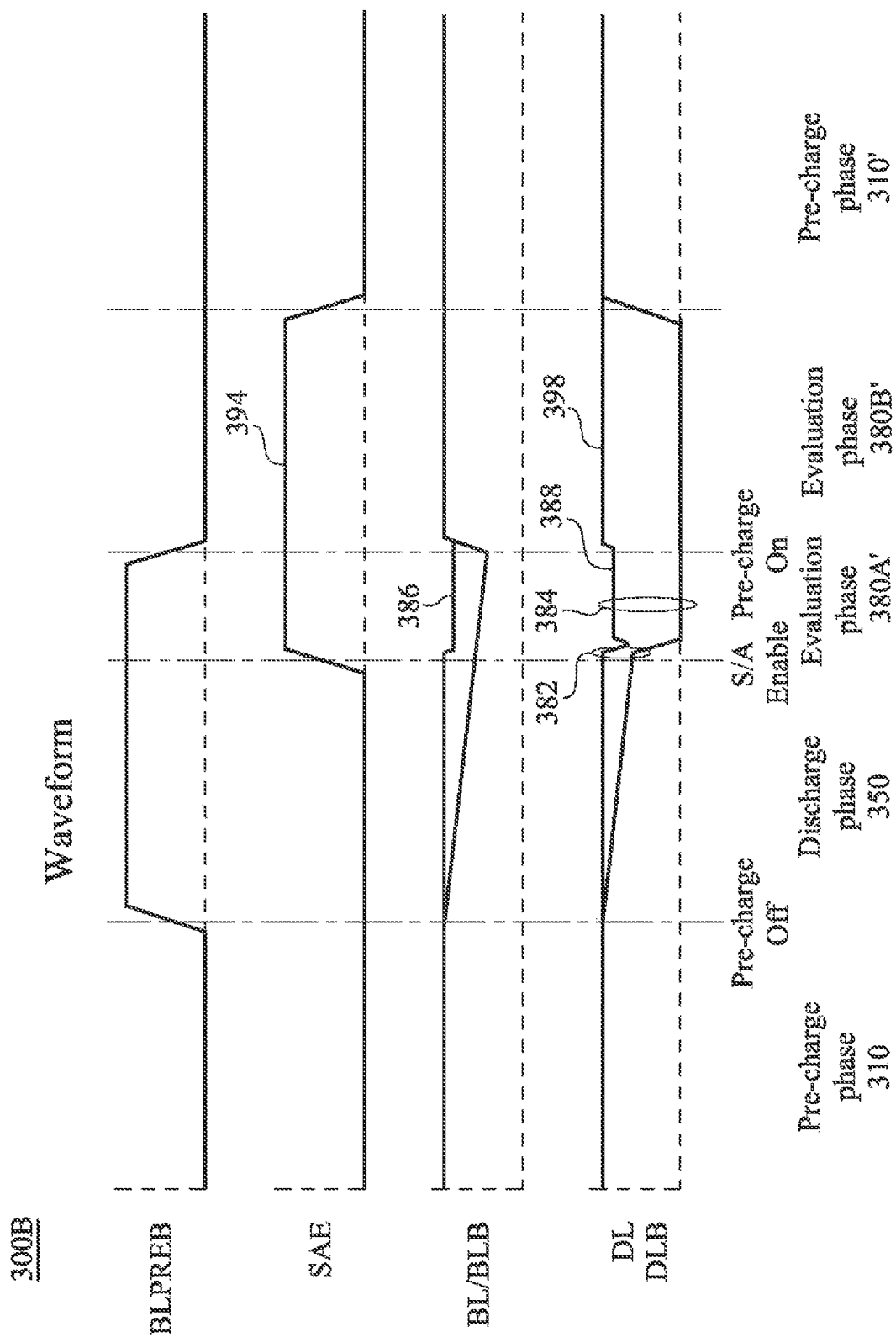

SENSE AMPLIFIER WITH REDUCED VOLTAGE OFFSET

CROSS-REFERENCE TO RELATED APPLICATION

This application claims priority to and benefit of U.S. Provisional Patent Application No. 63/230,518, filed Aug. 6, 2021, entitled "REDUCTION OF REQUIRED VOLTAGE OFFSET OF SENSE AMP USING A NEW CIRCUIT TECHNIQUE," which is incorporated herein by reference in its entirety for all purposes.

BACKGROUND

Developments in electronic devices, such as computers, portable devices, smart phones, interne of thing (IoT) devices, etc., have prompted increased demands for memory devices. In general, memory devices may be volatile memory devices and non-volatile memory devices. Volatile memory devices can store data while power is provided, but may lose the stored data once the power is shut off. Unlike volatile memory devices, non-volatile memory devices may retain data even after the power is shut off, but may be slower than the volatile memory devices. Sense amplifiers may be implemented to read data stored by memory devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3B illustrates a timing diagram of an operation of the sense amplifier, in accordance with some embodiments.

DETAILED DESCRIPTION

Figure 1:
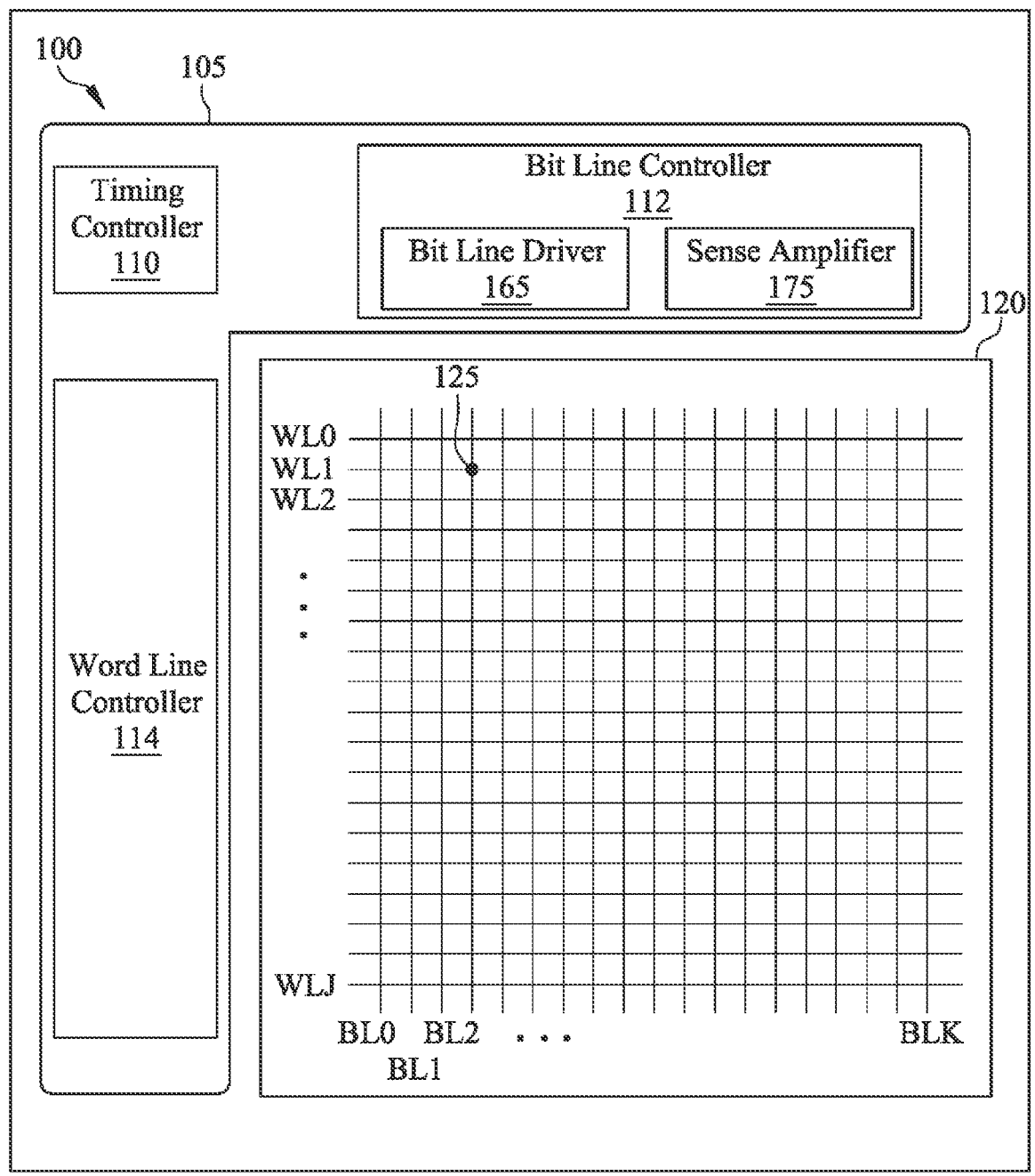
FIG. 1 illustrates a schematic block diagram of an example memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Disclosed herein is a sense amplifier with a reduced voltage offset. A voltage offset may be an amount of voltage of a signal applied to a sense amplifier as an input to correctly sense or determine data represented by the signal. For differential signals, a voltage offset may be a voltage difference between two differential signals applied to a sense amplifier as an input to correctly sense or determine data represented by the differential signals.

In some embodiments, the sense amplifier includes a first pair of cross-coupled transistors and a second pair of cross-coupled transistors coupled to a first port and a second port of the sense amplifier. In some embodiments, the sense amplifier includes a first access transistor coupled between a first input line (e.g., bit line BL) and the first port. In some embodiments, the sense amplifier includes a second access transistor coupled between a second input line (e.g., bit line BLB) and the second port. In some embodiments, the first pair of cross-coupled transistors includes a first transistor and a second transistor cross-coupled with each other. For example, a gate electrode of the first transistor is coupled to a drain electrode of the second transistor, and a gate electrode of the second transistor is coupled to a drain electrode of the first transistor. In some embodiments, a source electrode of the first transistor is electrically decoupled or separated from a source electrode of the second transistor. The source electrode of the first transistor may be directly coupled to the first input line, and the source electrode of the second transistor may be directly coupled to the second input line.

Advantageously, the disclosed sense amplifier may have a low voltage offset by separating the source electrode of the first transistor and the source electrode of the second transistor. In one aspect, a first voltage of the first input line (e.g., bit line BL) may be applied to the source electrode of the first transistor, where a second voltage of the second input line (e.g., bit line BLB) lower than the first voltage may be applied to the source electrode of the second transistor. Assuming that the first transistor and the second transistor are P-type transistors, by applying a lower voltage to the source electrode of the transistor, the second transistor can be less likely to falsely conduct than by applying the same voltage (e.g., supply voltage VDD) to both source electrodes of the first transistor and the second transistor. Accordingly, the first transistor and the second transistor may operate in a reliable manner despite process, voltage, temperature (PVT) variations, such that the voltage offset of the sense amplifier can be reduced. Moreover, the improved reliability allows the sense amplifier (or transistors) to be implemented in a smaller area.

Although some descriptions of the sense amplifier are provided herein for a memory device, the sense amplifier may be implemented for other devices, such as a communication device, a sensor device, a display device, or any computing device.

FIG. 1 is a diagram of a memory device 100, in accordance with one embodiment. In some embodiments, the memory device 100 includes a memory controller 105 and a memory array 120. The memory array 120 may include a plurality of storage circuits or memory cells 125 arranged in two- or three-dimensional arrays. Each memory cell 125 may be coupled to a corresponding word line WL and a corresponding bit line BL. The memory controller 105 may write data to or read data from the memory array 120 according to electrical signals through word lines WL and bit lines BL. In other embodiments, the memory device 100 includes more, fewer, or different components than shown in FIG. 1.

The memory array 120 is a hardware component that stores data. In one aspect, the memory array 120 is embodied as a semiconductor memory device. The memory array 120 includes a plurality of storage circuits or memory cells 125. The memory array 120 includes word lines WL0, WL1 . . . WLJ, each extending in a first direction (e.g., X-direction) and bit lines BL0, BL1 . . . BLK, each extending in a second direction (e.g., Y-direction). The word lines WL and the bit lines BL may be conductive metal rails or conductive traces. Each memory cell 125 may include a volatile memory, a non-volatile memory, or a combination of them. In one aspect, each memory cell 125 is coupled to a corresponding word line WL and a corresponding bit line BL, and can be operated according to voltages or currents through the corresponding word line WL and the corresponding bit line BL. In some embodiments, the memory array 120 includes bit lines BLB extending along the second direction (e.g., Y-direction). In one aspect, each bit line BL and a corresponding bit line BLB may be coupled to a memory cell 125, and the bit lines BL, BLB can provide a differential signal corresponding to data stored by the memory cell 125. The bit lines BL, BLB may receive and/or provide differential signals. In some embodiments, the memory array 120 includes additional lines (e.g., select lines, reference lines, reference control lines, power rails, etc.).

The memory controller 105 is a hardware component that controls operations of the memory array 120. In some embodiments, the memory controller 105 includes a bit line controller 112, a word line controller 114, and a timing controller 110. The bit line controller 112, the word line controller 114, and the timing controller 110 may be embodied as logic circuits, analog circuits, or a combination of them. In one configuration, the word line controller 114 is a circuit that provides a voltage or current through one or more word lines WL of the memory array 120, and the bit line controller 112 is a circuit that provides or senses a voltage or current through one or more bit lines BL of the memory array 120. In one configuration, the timing controller 110 is a circuit that provides control signals or clock signals to synchronize operations of the bit line controller 112 and the word line controller 114. The bit line controller 112 may be coupled to bit lines BL of the memory array 120, and the word line controller 114 may be coupled to word lines WL of the memory array 120. In some embodiments, the memory controller 105 includes more, fewer, or different components than shown in FIG. 1.

In some embodiments, the bit line controller 112 includes one or more bit line drivers 165 and one or more sense amplifiers 175. A bit line driver 165 is a circuit that generates and applies a voltage or current to a bit line BL for programming data or for pre-charging the bit line BL. A sense amplifier 175 is a circuit that senses a voltage or current through a bit line BL and amplifies the sensed voltage or current to read data stored by a memory cell 125. Detailed descriptions on configurations and operations of the sense amplifier 175 are provided below with respect to FIGS. 2 through 8. In some embodiments, the bit line controller 112 includes a multiplexer or switches (not shown) that can selectively couple one or more bit lines BL to the bit line driver 165 or the sense amplifier 175.

In one example, the timing controller 110 may generate control signals to coordinate operations of the bit line controller 112 and the word line controller 114. For example, the timing controller 110 may generate one or more enable signals to enable or disable operations of the bit line controller 112 and/or the word line controller 114. In one approach, to write data to a memory cell 125, the timing controller 110 may cause the word line controller 114 to apply a voltage or current to the memory cell 125 through a word line WL coupled to the memory cell 125 and cause the bit line driver 165 to apply a voltage or current corresponding to data to be stored to the memory cell 125 through a bit line BL coupled to the memory cell 125. In one approach, to read data from a memory cell 125, the timing controller 110 may cause the word line controller 114 to apply a voltage or current to the memory cell 125 through a word line WL coupled to the memory cell 125 and cause the sense amplifier 175 to sense a voltage or current corresponding to data stored by the memory cell 125 through a bit line BL coupled to the memory cell 125.

In some embodiments, the sense amplifier 175 or various components disclosed herein include one or more transistors. The transistors in this disclosure are shown to have a certain type (N-type or P-type), but embodiments are not limited thereto. The transistors can be any suitable type of transistor including, but not limited to, metal oxide semiconductor field effect transistors (MOSFETs), bipolar junction transistors (BJTs), high voltage transistors, high frequency transistors, FinFETs, planar MOS transistors with raised source/drains, nanosheet FETs, nanowire FETs, or the like. Furthermore, one or more transistors shown or described herein can be embodied as two or more transistors connected in parallel.

Figure 2:
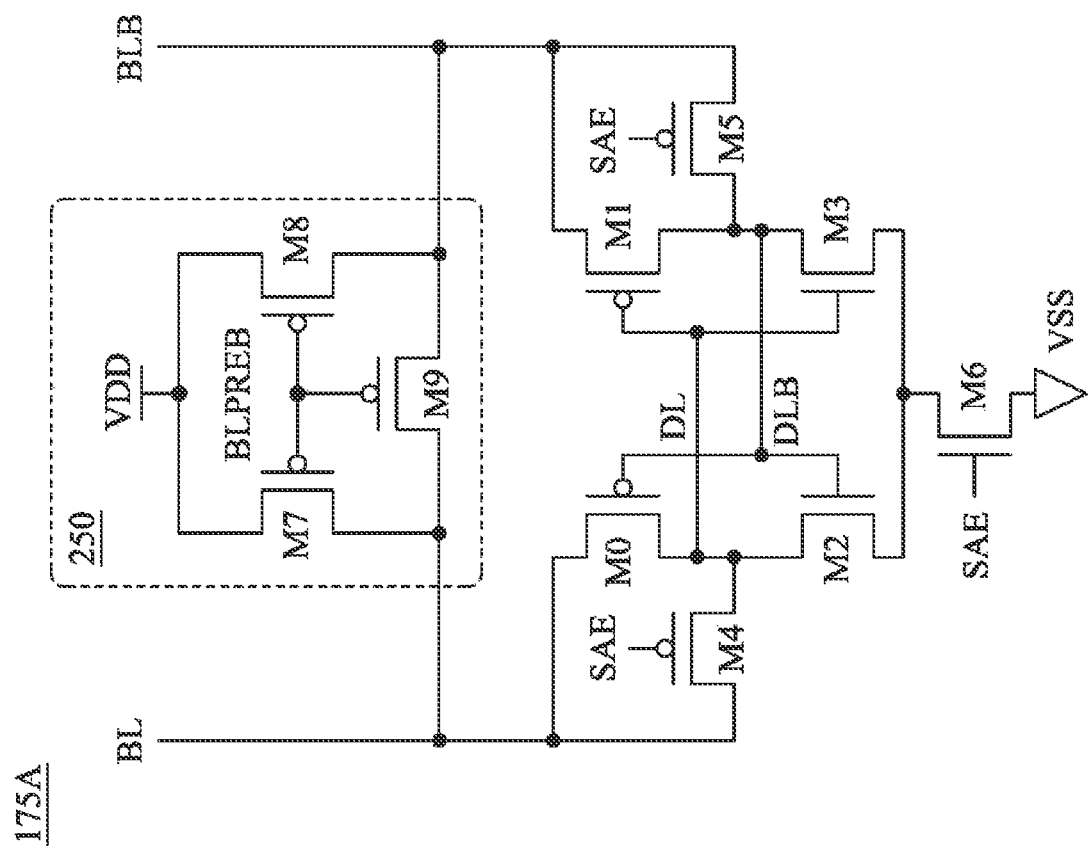
FIG. 2 illustrates a schematic diagram of a sense amplifier, in accordance with some embodiments.

FIG. 2 illustrates a schematic diagram of a sense amplifier 175A, in accordance with some embodiments. In some embodiments, the sense amplifier 175A includes transistors M0-M9. In some embodiments, the transistors M0, M1, M4, M5, M7-M9 are embodied as P-type transistors, and the transistors M2, M3, M6 are embodied as N-type transistors. In some embodiments, some of the transistors M0-M9 are embodied as different types of transistors than shown in FIG. 2. In one aspect, these components may operate together to read data stored by a memory cell 125 coupled to the bit lines BL, BLB. In some embodiments, the sense amplifier 175A includes more, fewer, or different components than shown in FIG. 2.

In some embodiments, the transistors M0-M3 constitute cross-coupled amplifiers to amplify signals at ports DL_IN, DLB_IN. In some embodiments, some of the transistors M0-M3 can be replaced by different components to perform the functionality of the transistors M0-M3 described herein. In one configuration, the transistor M0 includes i) a source electrode directly coupled to the bit line BL, for example, through one or more conductive traces or metal rails, ii) a gate electrode coupled to a gate electrode of the transistor M2 and the port DLB, and iii) a drain electrode coupled to a drain electrode of the transistor M2 and the port DL. In one configuration, the transistor M1 includes i) a source electrode directly coupled to the bit line BLB, for example, through one or more conductive traces or metal rails, ii) a gate electrode coupled to a gate electrode of the transistor M3 and the port DL, and iii) a drain electrode coupled to a drain electrode of the transistor M3 and the port DLB. In one configuration, the transistor M2 includes i) a source electrode coupled to a source electrode of the transistor M3, ii) a gate electrode coupled to the gate electrode of the transistor M0 and the port DLB, and iii) a drain electrode coupled to the drain electrode of the transistor M0 and the port DL. In one configuration, the transistor M3 includes i) a source electrode coupled to a source electrode of the transistor M2, ii) a gate electrode coupled to the gate electrode of the transistor M1 and the port DL, and iii) a drain electrode coupled to the drain electrode of the transistor M1 and the port DLB.

In one aspect, a pair of transistors M0, M1 constitute a pair of cross-coupled transistors, and a pair of transistors M2, M3 constitute another pair of cross-coupled transistors. A cross-coupled connection of a first device and a second device refers to an input of the first device connected to an output of the second device, and an input of the second device connected to an output of the first device. For example, for a pair of cross-coupled transistors including a first transistor and a second transistor, a gate electrode of the first transistor is coupled to a drain electrode of the second transistor and a gate electrode of the second transistor is coupled to a drain electrode of the first transistor. The cross-coupled connection can provide a positive feedback to amplify or increase a difference in a voltage at the gate electrode of the first transistor and a voltage at the gate electrode of the second transistor. By connecting the gate electrodes of the transistors M0, M2 and the drain electrodes of the transistors M1, M3 to the port DLB, and by connecting the gate electrodes of the transistors M1, M3 and the drain electrodes of the transistors M0, M2 to the port DL as shown in FIG. 1, the pair of transistors M0, M1 and the pair of transistors M2, M3 can provide positive feedback for amplifying a difference of the voltage at the port DL and the voltage at the port DLB.

In one aspect, the transistors M0, M2 constitute an amplifier, and the transistors M1, M3 constitute another amplifier. The amplifier formed by the transistors M0, M2 and the amplifier formed by the transistors M1, M3 may be complementary metal—oxide—semiconductor (CMOS) amplifiers. In one aspect, the transistor M0 can pull up a voltage at the port DL, in response to a difference between a voltage at the source electrode of the transistor M0 and a voltage at the gate electrode of the transistor M0 being larger than a threshold voltage of the transistor M0. In one aspect, the transistor M2 can pull down the voltage at the port DL, in response to a difference between a voltage at the gate electrode of the transistor M2 and a voltage at the source electrode of the transistor M2 being larger than a threshold voltage of the transistor M2. The transistors M1, M3 may operate in a similar manner as the transistors M0, M2 to pull up or pull down the voltage at the port DLB. In one aspect, the CMOS amplifier formed by the transistors M0, M2 and the CMOS amplifier formed by the transistors M1, M3 are cross coupled with each other. The cross-coupled connection of CMOS amplifiers including the transistors M0-M3 can provide a positive feedback that allows the CMOS amplifiers to detect a small difference between the voltage at the port DL and the voltage at the port DLB and amplify the detected difference such that the port DL and the port DLB can have a large voltage difference (e.g., VDD). Assuming for an example that 1.0 V is applied to the source electrodes of the transistors M0, M1, 0.449 V is applied to the port DL, and 0.501V is applied to the port DLB, the cross-coupled CMOS amplifiers including the transistors M0-M3 can amplify 0.002V difference, such that the voltage at the port DLB can be 1.0V and the voltage at the port DL can be 0V.

In some embodiments, the transistors M4, M5 operate as switches to electrically couple or decouple the bit line BL and the bit line BLB to the ports DL_IN, DLB_IN, respectively. The transistors M4, M5 may be also referred to as "access transistors" herein. In some embodiments, some of the transistors M4, M5 can be replaced by different components to perform the functionality of the transistors M4, M5 described herein. In one configuration, the transistor M4 includes i) a first electrode (e.g., source or drain electrode) coupled to the bit line BL, ii) a second electrode (e.g., drain or source electrode) coupled to the port DL, and iii) a gate electrode coupled to, for example, the timing controller 110 to receive an enable signal SAE. In one configuration, the transistor M5 includes i) a first electrode (e.g., source or drain electrode) coupled to the bit line BLB, ii) a second electrode (e.g., drain or source electrode) coupled to the port DLB, and iii) a gate electrode coupled to, for example, the timing controller 110 to receive the enable signal SAE. In this configuration, the transistor M4 may operate as a switch between the bit line BL and the port DL, and the transistor M5 may operate as a switch between the bit line BLB and the port DLB. In one example, in response to the enable signal SAE having a first state (e.g., 0V), the transistors M4, M5 may be enabled to electrically couple the bit line BL to the port DL and electrically couple the bit line BLB to the port DLB. Thus, when the transistors M4, M5 are enabled, a voltage of the bit line BL can be applied to the port DL and a voltage of the bit line BLB can be applied to the port DLB. In one example, in response to the enable signal SAE having a second state (e.g., 1V), the transistors M4, M5 may be disabled to electrically decouple or separate the bit line BL from the port DL and electrically decouple or separate the bit line BLB from the port DLB. Thus, when the transistors M4, M5 are disabled, a voltage of the bit line BL may not be applied to the port DL and a voltage of the bit line BLB may not be applied to the port DLB.

In one aspect, the transistor M6 operates as a switch to allow current to flow through the cross-coupled amplifiers (or the transistors M0-M3). In some embodiments, the transistor M6 can be replaced by a different component to perform the functionality of the transistor M6 described herein. In one configuration, the transistor M6 includes i) a source electrode coupled to a metal rail to receive a source voltage (VSS) or a ground voltage, ii) a drain electrode coupled to source electrodes of the transistors M2, M3, and iii) a gate electrode coupled to, for example, the timing controller 110 to receive the enable signal SAE. In this configuration, the transistor M6 may enable or disable amplification by the cross-coupled amplifiers (or the transistors M0-M3) by allowing or preventing current through the cross-coupled amplifiers. In one aspect, in response to the enable signal SAE having a first state (e.g., 0V), the transistor M6 may be disabled to electrically decouple or separate the drain electrode of the transistor M6 from the source electrode of the transistor M6, such that current may not flow through the cross-coupled amplifiers (or the transistors M0-M3). Thus, when the transistor M6 is disabled, the cross-coupled amplifiers (or the transistors M0-M3) may not perform amplification, because no current can flow through the transistors M0-M3. In one aspect, in response to the enable signal SAE having a second state (e.g., 1V), the transistor M6 may be enabled to electrically couple the drain electrode of the transistor M6 to the source electrode of the transistor M6, such that current may flow through the cross-coupled amplifiers (or the transistors M0-M3). Thus, when the transistor M6 is enabled, the cross-coupled amplifiers (or the transistors M0-M3) may perform amplification, because current may flow through the transistors M0-M3.

In one aspect, the transistors M7-M9 operate as a pre-charge circuit 250 to set voltages of the bit lines BL, BLB. In some embodiments, some of the transistors M7-M9 can be replaced by a different component to perform the functionality of the transistors M7-M9 described herein. In one configuration, the transistor M7 includes i) a source electrode coupled to a metal rail to receive a supply voltage VDD, ii) a drain electrode coupled to the bit line BL, and iii) a gate electrode coupled to gate electrodes of the transistors M8, M9. In one configuration, the transistor M8 includes i) a source electrode coupled to the metal rail to receive the supply voltage VDD, ii) a drain electrode coupled to the bit line BLB, and iii) a gate electrode coupled to gate electrodes of the transistors M7, M9. In one configuration, the transistor M9 includes i) a first electrode (e.g., source or drain electrode) coupled to the bit line BL, ii) a second electrode (e.g., drain or source electrode) coupled to the bit line BLB, and iii) a gate electrode coupled to gate electrodes of the transistors M7, M8. In one configuration, the gate electrodes of the transistors M7-M9 are coupled to, for example, the timing controller 110 to receive a pre-charge enable signal BLPREB. In one example, in response to the pre-charge enable signal BLPREB having a first state (e.g., 0V), the transistors M7-M9 may be enabled to electrically couple the bit lines BL, BLB to the metal rail to receive the supply voltage VDD. Hence, when the transistors M7-M9 are enabled, the bit lines BL, BLB can be pre-charged to have the supply voltage VDD. In one example, in response to the pre-charge enable signal BLPREB having a second state (e.g., 1V), the transistors M7-M9 may be disabled to electrically decouple or separate the bit line BL, the bit line BLB, and the metal rail to receive the supply voltage VDD. Hence, when the transistors M7-M9 are disabled, the bit lines BL, BLB may not receive the supply voltage VDD. In one aspect, the bit lines BL, BLB can be coupled to a memory cell 125 when the transistors M7-M9 are disabled, such that the voltages at the bit lines BL, BLB can be discharged or changed, according to data stored by the memory cell 125. For example, if the memory cell 125 stores a bit '0', then the bit line BLB can be discharged faster than the bit line BL such that the bit line BL may have a higher voltage than the bit line BLB. For example, if the memory cell 125 stores a bit '1', then the bit line BL can be discharged faster than the bit line BLB such that the bit line BLB may have a higher voltage than the bit line BL.

In one aspect, the source electrode of the transistor M0 is directly coupled to the bit line BL, and the source electrode of the transistor M1 is directly coupled to the bit line BLB, such that the voltage offset of the cross-coupled amplifiers formed by the transistors M0-M3 can be reduced. A voltage offset may be an amount of voltage of a signal applied to a sense amplifier as an input to correctly sense or determine data represented by the signal. For differential signals, a voltage offset may be a voltage difference between two differential signals applied to a sense amplifier as an input to correctly sense or determine data represented by the differential signals. Assuming for an example that the bit line BL has a lower voltage than the bit line BLB according to the data stored by a memory cell 125, when the cross-coupled amplifiers (e.g., transistors M0-M3) perform amplification by disabling the transistors M4, M5 and enabling the transistor M6, the lower voltage of the bit line BL can be applied to the source electrode of the transistor M0 through the direct connection and the higher voltage of the bit line BLB can be applied to the source electrode of the transistor M1 through the direct connection. Accordingly, the transistor M0 may have a negative Vsg (e.g., a difference between a voltage at the source electrode and a voltage at the gate electrode is negative), where the transistor M1 may have a positive Vsg (e.g., a difference between a voltage at the source electrode and a voltage at the gate electrode is positive). Thus, the transistor M0 can be less likely to falsely conduct than when the same voltage (e.g., supply voltage VDD) is applied to both source electrodes of the transistors M0, M1. Moreover, the cross-coupled amplifiers (e.g., formed by transistors M0-M3) may operate in a reliable manner despite PVT variations, such that the voltage offset of the sense amplifier 175A can be reduced. Moreover, the improved reliability allows the sense amplifier 175A or transistors M0-M3 to be implemented in a smaller area.

Figure 3A:
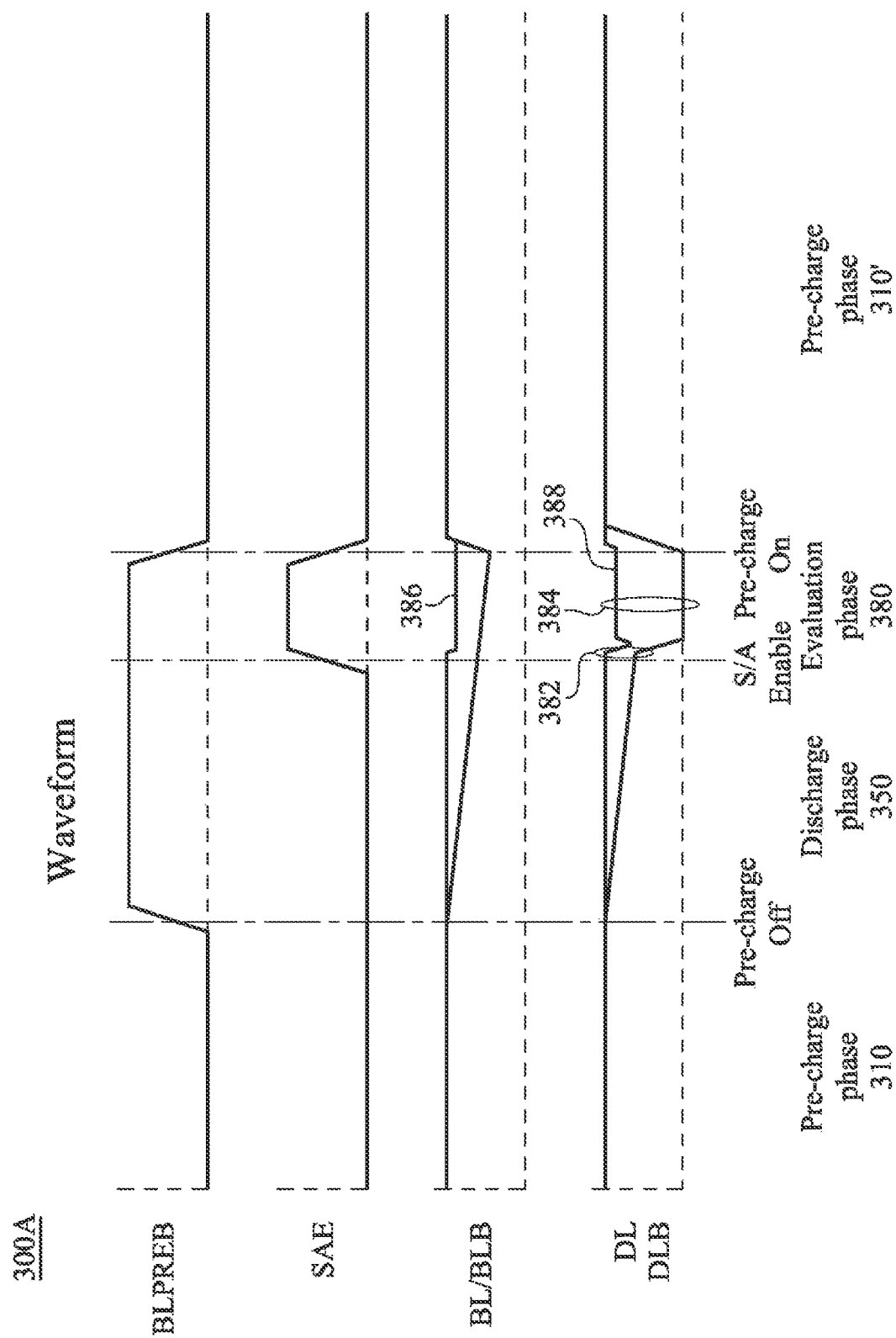
FIG. 3A illustrates a timing diagram of an operation of the sense amplifier, in accordance with some embodiments.

FIG. 3A illustrates a timing diagram 300A of an operation of the sense amplifier 175A, in accordance with some embodiments. In one aspect, the sense amplifier 175A operates in three phases: pre-charge phase 310, discharge phase 350, and an evaluation phase 380. In one aspect, the timing controller 110 may generate control signals BLPREB, SAE to cause the sense amplifier 175A to operate in different phases. In some embodiments, the timing controller 110 may generate signals having different states than shown in FIG. 3A. In some embodiments, the sense amplifier 175A operates in different phases or in a different manner than shown in FIG. 3A.

In the pre-charge phase 310, the timing controller 110 generates the pre-charge enable signal BLPREB having a first state (e.g., 0V) to enable pre-charging. In response to the pre-charge enable signal BLPREB having the first state, the transistors M7-M9 can be enabled to apply the supply voltage VDD to the bit lines BL, BLB. In the pre-charge phase 310, the timing controller 110 may also generate a control signal to configure a multiplexer or one or more switches to decouple memory cells 125 from the bit lines BL, BLB. In the pre-charge phase 310, the timing controller 110 also generates the enable signal SAE having a first state (e.g., 0V) to disable the transistor M6 such that the cross-coupled amplifiers (e.g., transistors M0-M3) may not perform amplification. In response to the enable signal SAE having the first state, the transistor M4 can be enabled to apply the voltage of the bit line BL to the port DL and the transistor M5 can be enabled to apply the voltage of the bit line BLB to the port DLB. Because the bit lines BL, BLB are pre-charged to have the supply voltage VDD in the pre-charge phase 310, the bit line BL may apply the supply voltage VDD to the port DL and the bit line BLB may apply the supply voltage VDD to the port DLB in the pre-charge phase 310. In one aspect, the direct connection of the source electrode of the transistor M0 to the bit line BL allows the bit line BL to apply the supply voltage VDD to the source electrode of the transistor M0 in the pre-charge phase 310. Similarly, in one aspect, the direct connection of the source electrode of the transistor M1 to the bit line BLB allows the bit line BLB to apply the supply voltage VDD to the source electrode of the transistor M1 in the pre-charge phase 310.

In the discharge phase 350, the timing controller 110 generates the pre-charge enable signal BLPREB having a second state (e.g., 1V or VDD) to disable pre-charging. In response to the pre-charge enable signal BLPREB having the second state, the transistors M7-M9 can be disabled, such that the supply voltage VDD may not be applied to the bit lines BL, BLB. In the discharge phase 350, the timing controller 110 also generates a control signal to configure a multiplexer or one or more switches to couple one or more selected memory cells 125 to the bit lines BL, BLB. Hence, according to the data stored by the one or more memory cells 125, the bit line BL or the BLB may discharge. For example, if the memory cell 125 stores a bit '0', then the bit line BLB can be discharged such that the bit line BL may have a higher voltage than the bit line BLB. For example, if the memory cell 125 stores a bit '1', then the bit line BL can be discharged such that the bit line BLB may have a higher voltage than the bit line BL. In the discharge phase 350, the timing controller 110 also generates the enable signal SAE having a first state (e.g., 0V) to disable the transistor M6, such that the cross-coupled amplifiers (e.g., transistors M0-M3) may not perform amplification. In response to the enable signal SAE having the first state, the transistor M4 can be enabled to apply the voltage of the bit line BL to the port DL and the transistor M5 can be enabled to apply the voltage of the bit line BLB to the port DLB. Hence, the voltage of the port DL may follow or track the voltage of the bit line BL, and the voltage of the port DLB may follow or track the voltage of the bit line BLB in the discharge phase 350.

In the evaluation phase 380, the timing controller 110 generates the pre-charge enable signal BLPREB having a second state (e.g., 1V or VDD) to disable pre-charging. In the evaluation phase 380, the timing controller 110 also generates the enable signal SAE having a second state (e.g., 1V) to enable the transistor M6, such that the cross-coupled amplifiers (e.g., transistors M0-M3) may perform amplification. In response to the enable signal SAE having the second state, the transistors M4, M5 can be disabled to electrically decouple or separate the bit line BL from the port DL and electrically decouple or separate the bit line BLB from the port DLB. Hence, the voltage of the port DL may not follow or track the voltage of the bit line BL, and the voltage of the port DLB may not follow or track the voltage of the bit line BLB in the evaluation phase 380. Meanwhile, the transistor M6 is enabled such that the cross-coupled amplifiers (e.g., formed by the transistors M0-M3) may detect a difference 382 in voltages at the ports DL, DLB and amplify the difference 382 to obtain a large voltage difference 384 at the ports DL, DLB through a positive feedback. According to the large voltage difference 384, data stored by one or more selected memory cells 125 can be determined. For example, another circuit or a processor may be coupled to the ports DL, DLB, and determine the state of the data stored, according to the voltage difference of the voltage at the port DL and the voltage at the port DLB.

After the evaluation phase 380, the timing controller 110 may generate control signals (e.g., SAE, BLPREB) to operate the sense amplifier 175A in the pre-charge phase 310'. For example, in the pre-charge phase 310', the pre-charge enable signal BLPREB may be set to the first state (e.g., 0V or GND), and the enable signal SAE may be set to the first state (e.g., 0V or GND), such that the pre-charge circuit 250 can be enabled and the access transistors M4, M5 can be enabled, while the amplification by the cross-coupled amplifiers (e.g., transistors M0-M3) is disabled. Accordingly, the voltages at the bit lines BL, BLB and the voltages at the ports DL, DLB can be set to the supply voltage VDD.

In one aspect, direct connections of the source electrodes of the transistors M0, M1 to the bit lines BL, BLB may cause voltages at the bit line BL and the port DL (or the bit line BLB and the port DLB) in the evaluation phase 380 to be lower than the supply voltage VDD, because the source electrodes of the transistors M0, M1 are not directly connected to the metal rail to receive the supply voltage VDD. In one example, the voltage 386 of the bit line BLB and the voltage 388 at the port DLB may be 100~200 mV lower than the supply voltage VDD. Despite the lowered voltages 386, 388, the voltage difference 384 is large enough that data stored by the memory cell 125 can be correctly determined. As discussed above with respect to FIG. 2, by separating the source electrode of the transistor M0 and the source electrode of the transistor M1 and directly coupling the source electrodes of the transistors M0, M1 to the bit lines BL, BLB, respectively, a negative Vsg can be applied to one of the transistors M0, M1 while a positive Vsg can be applied to the other of the transistors M0, M1. Accordingly, the reliability of the sense amplifier 175A can be improved, and the voltage offset of the sense amplifier 175 can be reduced.

FIG. 3B illustrates a timing diagram 300B of an operation of the sense amplifier 175A, in accordance with some embodiments. In one aspect, the timing diagram 300B is similar to the timing diagram 300A, except the evaluation phase 380'. Thus, the detailed description on the duplicated portion thereof is omitted herein for the sake of brevity. In one aspect, the evaluation phase 380' includes two portions: i) a first portion 380A' after the amplification by the cross-coupled amplifiers (e.g., transistors M0-M3) is enabled and before the pre-charge charge circuit 250 is enabled, and ii) a second portion 380B' after the pre-charge circuit 250 is enabled and before amplification by the cross-coupled amplifiers (e.g., transistors M0-M3) is disabled.

In the first portion 380A' of the evaluation phase 380', the sense amplifier 175A operates in a similar manner as in the evaluation phase 380 in FIG. 3A. Thus, the detailed description on the duplicated portion thereof is omitted herein for the sake of brevity.

In the second portion 380B' of the evaluation phase 380', the timing controller 110 generates the pre-charge enable signal BLPREB having the first state (e.g., 0V) to enable pre-charging. In response to the pre-charge enable signal BLPREB having the first state, the transistors M7-M9 can be enabled to apply the supply voltage VDD to the bit lines BL, BLB. In the second portion 380B' of the evaluation phase 380', the timing controller 110 also generates the enable signal SAE having the second state (e.g., 1V) to enable the transistor M6, such that the cross-coupled amplifiers (e.g., transistors M0-M3) may perform amplification. In response to the enable signal SAE having the second state, the transistors M4, M5 can be disabled to electrically decouple or separate the bit line BL from the port DL and electrically decouple or separate the bit line BLB from the port DLB. Hence, the voltage of the port DL may not follow or track the voltage of the bit line BL, and the voltage of the port DLB may not follow or track the voltage of the bit line BLB in the second portion 380B' of the evaluation phase 380'.

In the second portion 380B' of the evaluation phase 380', another circuit or a processor may be coupled to the ports DL, DLB, and determine the state of the data stored, according to the voltage difference of the voltage at the port DL and the voltage at the port DLB. In one aspect, because the transistors M7-M9 are enabled, the supply voltage VDD can be applied to the source electrodes of the transistors M0, M1 through the bit lines BL, BLB and the direct connections. By applying the supply voltage VDD to the source electrodes of the transistors M0, M1, the voltage 388 can be pulled up to the voltage 398 (or VDD) in the second portion 380B' of the evaluation phase 380', to increase the voltage difference at the voltage of the port DL and the port DLB. The increased voltage difference may allow the another circuit or processor to better detect the data stored.

Figure 4:
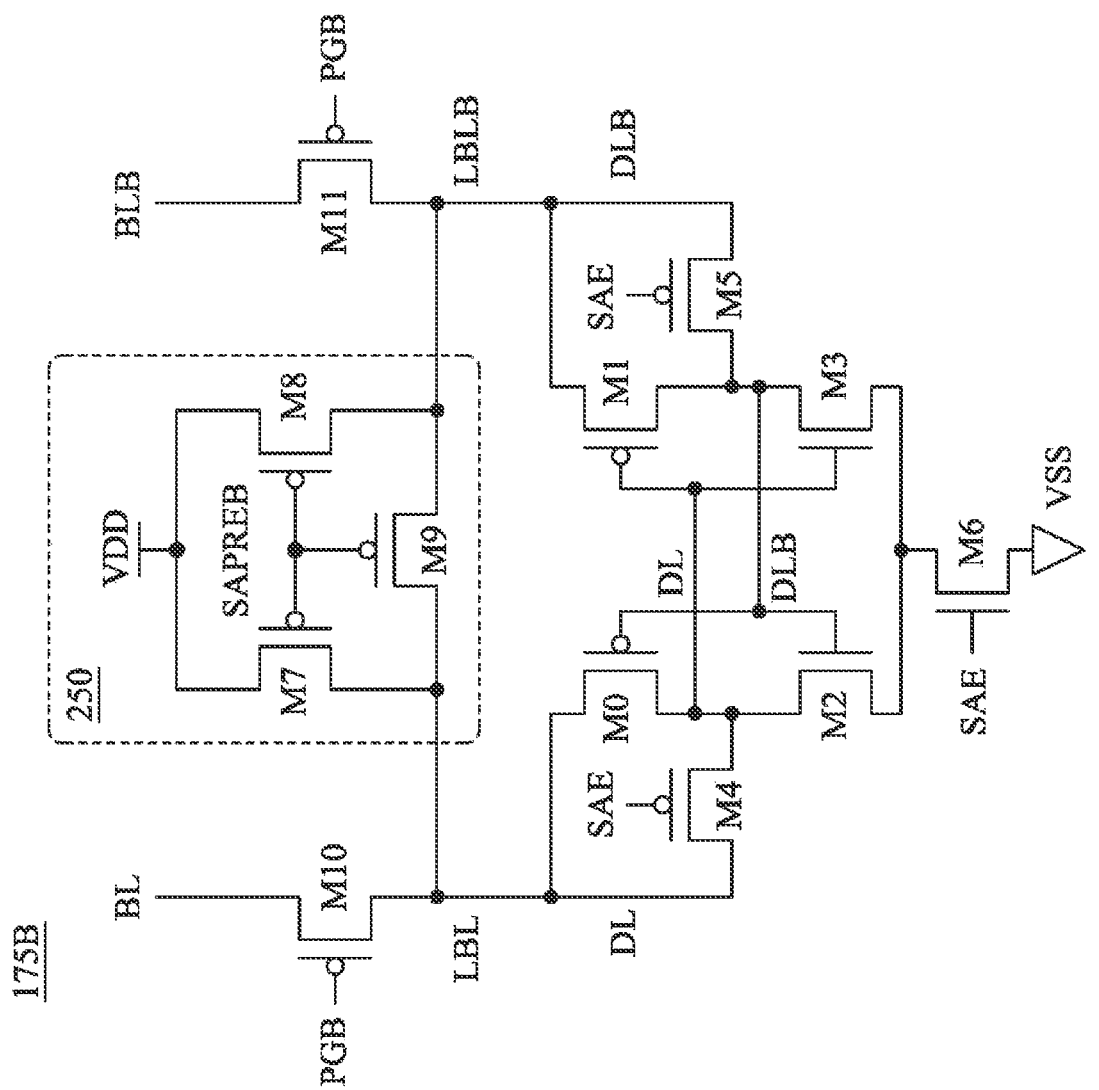
FIG. 4 illustrates a schematic diagram of a sense amplifier including switches coupled to bit lines of a memory cell, in accordance with some embodiments.

FIG. 4 illustrates a schematic diagram of a sense amplifier 175B including switches M10, M11 coupled to the bit lines BL, BLB of a memory cell 125, in accordance with some embodiments. In some embodiments, the configurations and operations of the sense amplifier 175B are similar to the configurations and operations of the sense amplifier 175A, except i) the source electrode of the transistor M0 and an electrode of the transistor M4 are directly coupled to a local bit line LBL instead of the bit line BL, ii) the source electrode of the transistor M1 and an electrode of the transistor M5 are directly coupled to a local bit line LBLB instead of the bit line BLB, and iii) the transistors M10, M11 are coupled to the bit lines BL, BLB, respectively. Thus, detailed description of duplicated portion is omitted herein for the sake of brevity. In some embodiments, the sense amplifier 175B includes more, fewer, or different components than shown in FIG. 4.

In some embodiments, the transistors M10, M11 operate as switches. The transistors M10, M11 may be embodied as P-type transistors. In some embodiments, the transistors M10, M11 may be replaced by other components that can perform the functionality of the transistors M10, M11 described herein. In one configuration, the transistor M10 includes i) a first electrode (e.g., source or drain electrode) coupled to the local bit line LBL, ii) a second electrode (e.g., drain or source electrode) coupled to the bit line BL, and iii) a gate electrode coupled to, for example, the timing controller 110 to receive a connection enable signal PGB. In one configuration, the transistor M11 includes i) a first electrode (e.g., source or drain electrode) coupled to the local bit line LBLB, ii) a second electrode (e.g., drain or source electrode) coupled to the bit line BLB, and iii) a gate electrode coupled to, for example, the timing controller 110 to receive the connection enable signal PGB. The local bit lines LBL, LBLB may be metal rails or conductive traces. In this configuration, the transistors M10, M11 may selectively couple the bit line BL to the local bit line LBL and the bit line BLB to the local bit line LBLB, according to the connection enable signal PGB. For example, in response to the connection enable signal having a first state (e.g., 0V), the transistors M10, M11 may be enabled to electrically couple the bit line BL to the local bit line LBL and electrically couple the bit line BLB to the local bit line LBLB. For example, in response to the connection enable signal having a second state (e.g., 1V), the transistors M10, M11 may be disabled to electrically decouple or separate the bit line BL from the local bit line LBL and electrically decouple or separate the bit line BLB from the local bit line LBLB. Accordingly, a memory cell 125 and the bit lines BL, BLB can be selectively coupled to or decoupled from the local bit lines LBL, LBLB to prevent the pre-charge circuit 250 and/or the cross-coupled amplifiers (e.g., M0-M3) from interfering with or damaging data stored by the memory cell 125.

Figure 5:
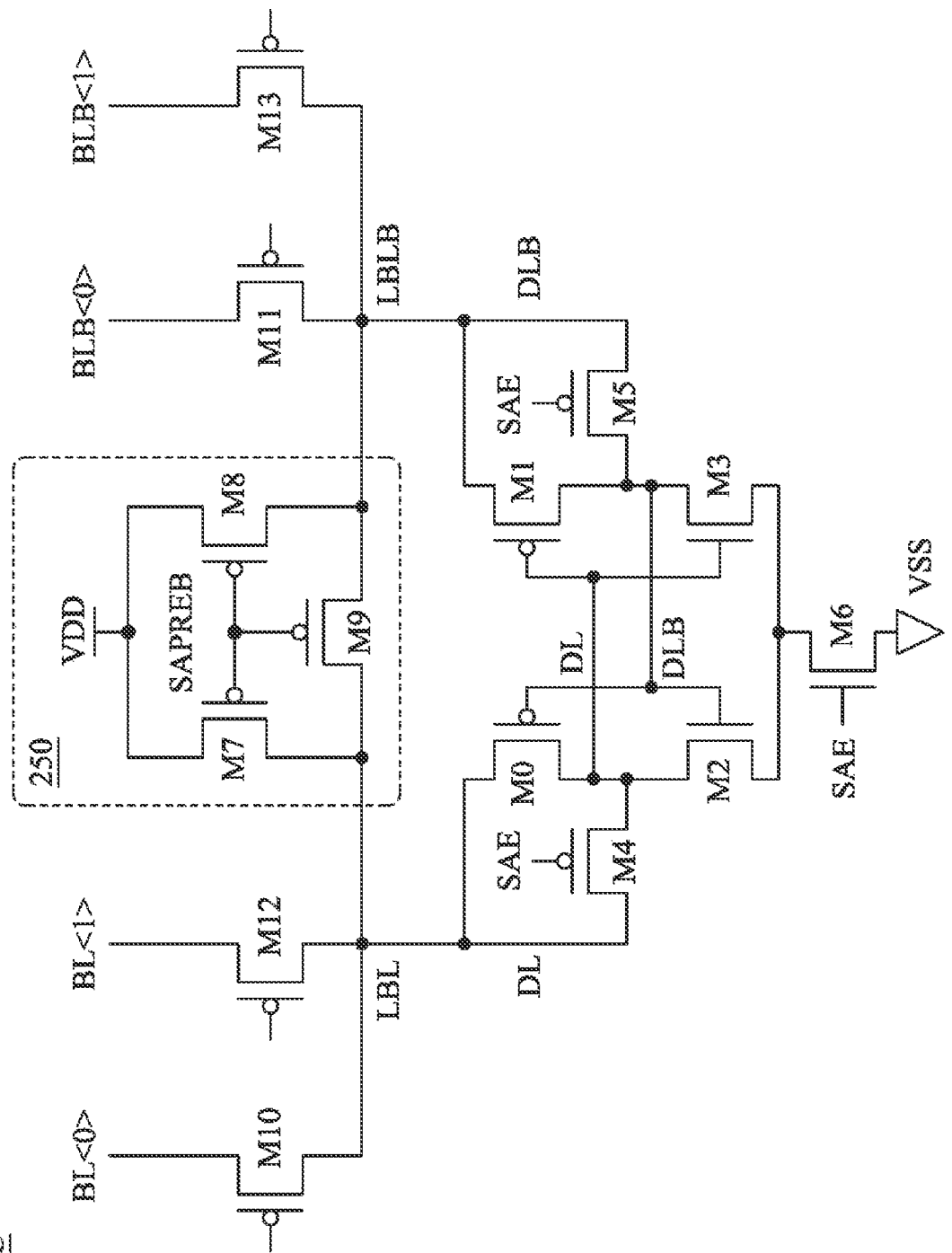
FIG. 5 illustrates a schematic diagram of a sense amplifier including multiple switches coupled to bit lines of memory cells, in accordance with some embodiments.

FIG. 5 illustrates a schematic diagram of a sense amplifier 175C including multiple switches M10-M13 coupled to bit lines BL<0>, BL<1>, BLB<0>, BLB<1>, in accordance with some embodiments. In some embodiments, the configurations and operations of the sense amplifier 175C are similar to the configurations and operations of the sense amplifier 175B, except i) the transistor M10 is coupled between the local bit line LBL and the bit line BL<0>, ii) the transistor M11 is coupled between the local bit line LBLB and the bit line BLB<0>, iii) the transistor M12 is coupled between the local bit line LBL and the bit line BL<1>, and iv) the transistor M13 is coupled between the local bit line LBLB and the bit line BLB<1>. Thus, detailed description of duplicated portion is omitted herein for the sake of brevity. The transistors M10-M13 may be embodied as P-type transistors. In some embodiments, the transistors M10-M13 may be replaced by other components that can perform the functionality of the transistors M10-M13 described herein. In one configuration, a first memory cell 125<0> may be coupled to the bit lines BL<0>, BLB<0>, and a second memory cell 125<1> may be coupled to the bit lines BL<1>, BLB<1>. Hence, the transistors M10-M13 can be configured, such that a selected memory cell 125 can be coupled to the local bit lines LB, LBL. Thus, a single sense amplifier 175C can be shared among multiple memory cells 125, and the switches M10-M13 can be selectively configured to read data stored by different memory cells 125. In some embodiments, the sense amplifier 175C includes more, fewer, or different components than shown in FIG. 5.

Figure 6:
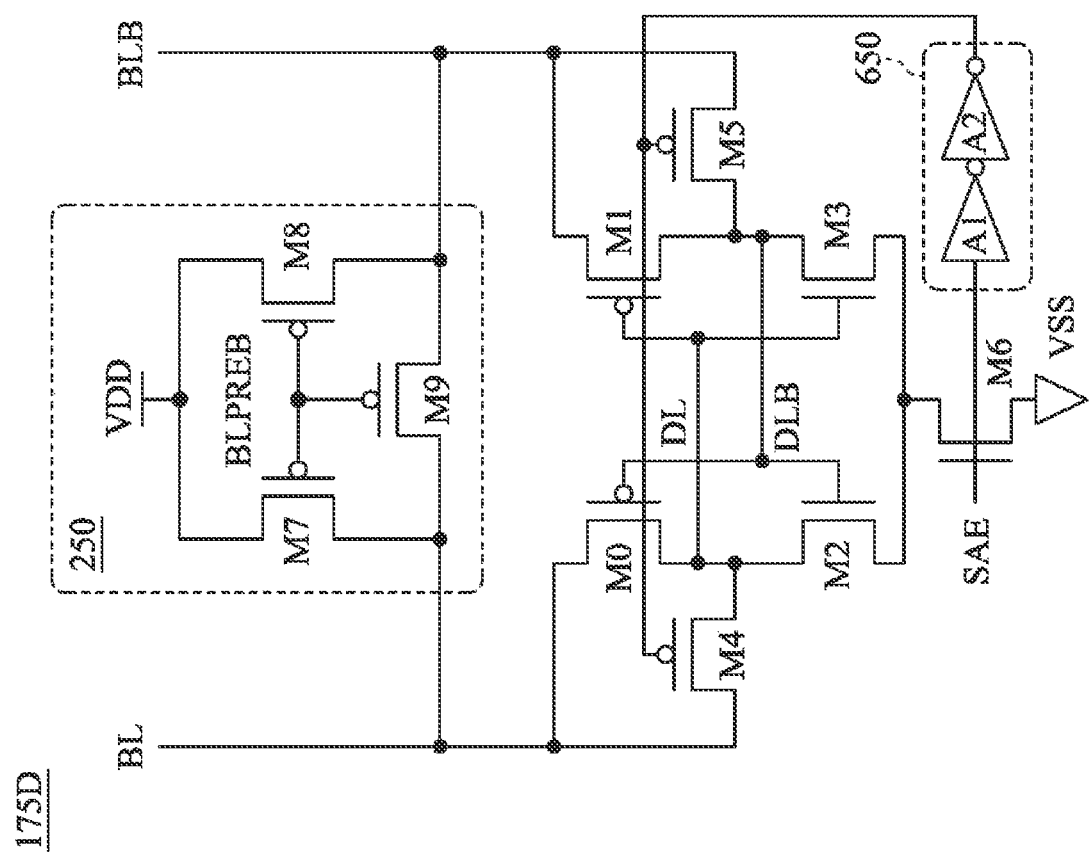
FIG. 6 illustrates a schematic diagram of a sense amplifier including a delay circuit, in accordance with some embodiments.

FIG. 6 illustrates a schematic diagram of a sense amplifier 175D including a delay circuit 650, in accordance with some embodiments. In some embodiments, the configurations and operations of the sense amplifier 175D are similar to the configurations and operations of the sense amplifier 175A, except the delay circuit 650 is added between i) the gate electrode of the transistor M6 and ii) gate electrodes of the transistors M4, M5. Thus, detailed description of duplicated portion is omitted herein for the sake of brevity. In some embodiments, the delay circuit 650 can be replaced by a different component that performs the functionality of the delay circuit 650 described herein. In some embodiments, the delay circuit 650 can delay the enable signal SAE, and apply the delayed signal to the gate electrodes of the transistors M4, M5. By applying the delayed signal to the gate electrodes of the transistors M4, M5, a time to disable the access transistors M4, M5 can be delayed with respect to a time to enable the enable transistor M6. By delaying the time to disable the access transistors M4, M5 with respect to the time to enable the enable transistor M6, amplification by the cross-coupled amplifiers (e.g., M0-M3) can be performed while the discharging of the bit line BL or the bit line BLB occurs. Hence, the amplification can be performed for a larger difference in voltages at the bit lines BL, BLB, such that the sense amplifier 175D can operate in a more reliable manner. In some embodiments, the sense amplifier 175D includes more, fewer, or different components than shown in FIG. 6.

Figure 7:
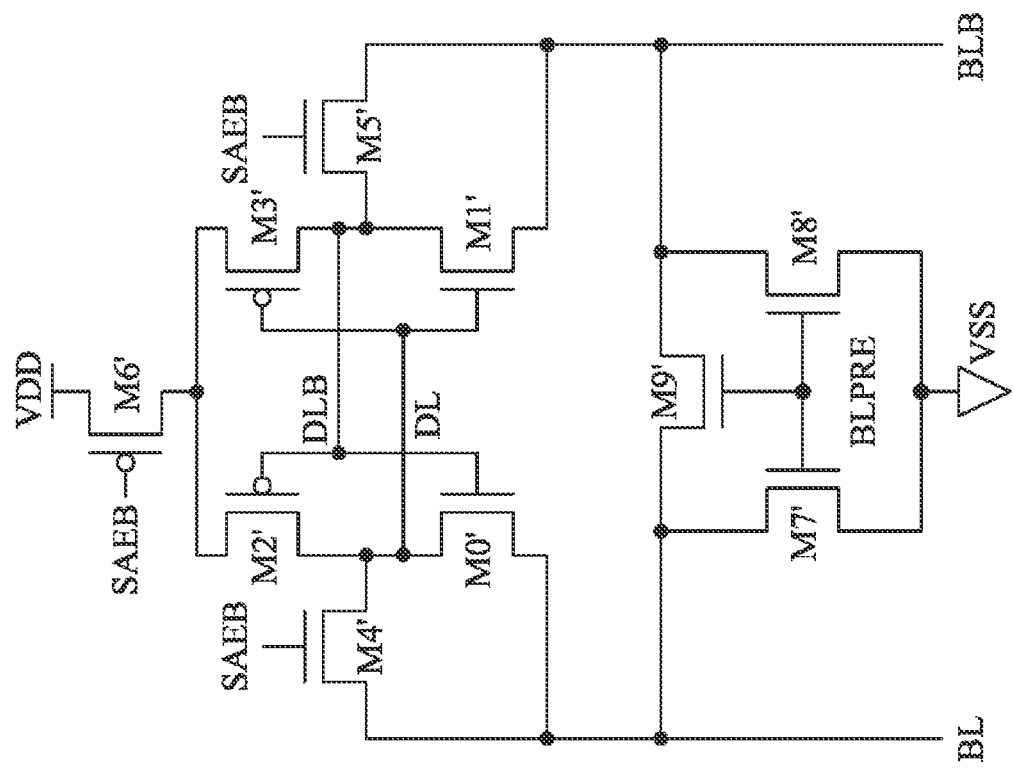
FIG. 7 illustrates a schematic diagram of a sense amplifier, in accordance with some embodiments.

FIG. 7 illustrates a schematic diagram of a sense amplifier 175E, in accordance with some embodiments. In some embodiments, the configurations and operations of the sense amplifier 175E are similar to the configurations and operations of the sense amplifier 175A, except i) the transistors M0-M9 are replaced by counterpart transistors M0'-M9', ii) the signals SAEB, BLPRE having opposite phases with respect to the signals SAE, BLPREB are applied, iii) the source electrode of the transistor M6' is coupled to the metal rail to receive the supply voltage VDD, and iv) the transistors M7', M8' are coupled to the metal rail to receive the source voltage VSS such that the bit lines BL, BLB can be pre-charged to have the source voltage VSS (or the ground voltage) instead of the supply voltage VDD. In some embodiments, the transistors M0', M1', M4', M5', M7'-M9' are embodied as N-type transistors, and the transistors M2', M3', M6' are embodied as P-type transistors. In one aspect, implementing the sense amplifier 175E with counterpart transistors M0'-M9' as shown in FIG. 7 may provide design flexibility. For example, N-type transistors are generally smaller than the P-type transistors, such that the sense amplifier 175E may be implemented in a smaller area than the sense amplifier 175A. For example, the sense amplifier 175E may be implemented where pre-charging the bit lines BL, BLB to 0V is more desirable, for example, due to particular design and operations of the memory cells 125. In some embodiments, some of the transistors M0'-M9' are embodied as different types of transistors than shown in FIG. 7. In some embodiments, the sense amplifier 175E includes more, fewer, or different components than shown in FIG. 7.

Figure 8:
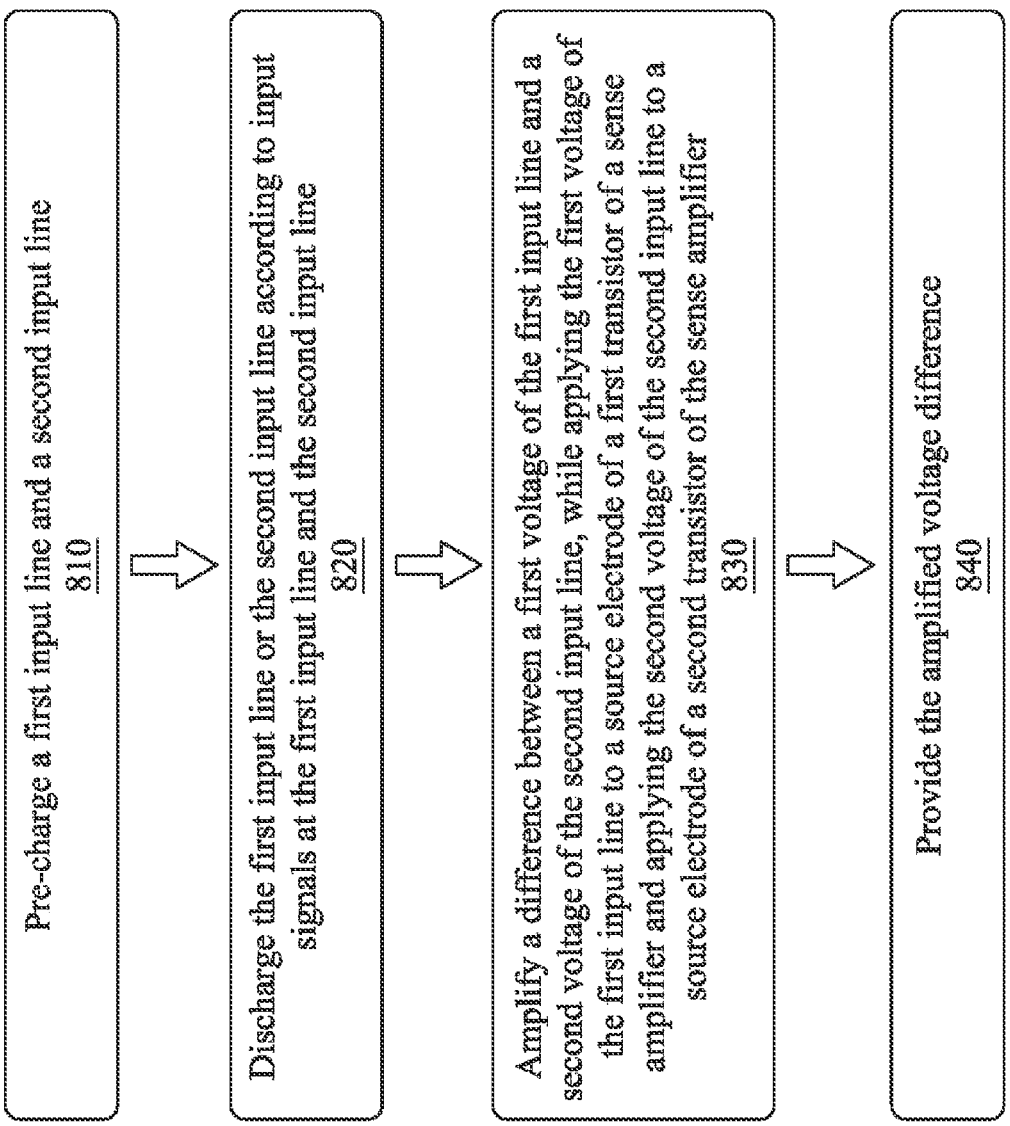
FIG. 8 is a flowchart showing a process of sensing data by a sense amplifier, in accordance with some embodiments.

FIG. 8 is a flowchart showing a process 800 of sensing data by a sense amplifier (e.g., sense amplifiers 175A-175E, etc.), in accordance with some embodiments. In some embodiments, the process 800 is performed by the sense amplifier (e.g., sense amplifiers 175A-175E, etc.), according to control signals (e.g., SAE, BLPREB, etc.) generated by a controller (e.g., timing controller 110). In some embodiments, the process 800 is performed by other entities. In some embodiments, the process 800 includes more, fewer, or different steps than shown in FIG. 8.

In one approach, the sense amplifier 175 pre-charges 810 a first input line (e.g., BL, LBL) and a second bit line (e.g., BLB, LBLB) coupled to a memory cell (e.g., memory cell 125) in a pre-charge phase (e.g., pre-charge phase 310). For example, the sense amplifier 175 receives the enable signal SAE having a first state (e.g., low state or 0V) and the pre-charge enable signal BLPREB having the first state (e.g., low state or 0V) from the controller (e.g., timing controller 110) in the pre-charge phase. In response to the pre-charge enable signal BLPREB having the first state, a pre-charge circuit (e.g., pre-charge circuit 250) can be enabled to set a voltage at the first input line (e.g., BL, LBL) and a voltage at the second input line (e.g., BLB, LBLB) to a predetermined voltage (e.g., supply voltage VDD). In response to the enable signal SAE having the first state, access transistors (e.g., transistors M4, M5) may be enabled and an enable transistor (e.g., transistor M6) may be disabled, such that the voltage of the first input line (e.g., BL, LBL) and the voltage at the second input line (e.g., BLB, LBLB) can be applied to ports (e.g., DL, DLB) of the sense amplifier 175 and amplification by the cross-coupled amplifiers (e.g., transistors M0-M3) can be disabled. Hence, in the pre-charge phase, the first input line, the second input line, and the ports (e.g., DL, DLB) may have the same voltage (e.g., supply voltage VDD).

In one approach, the sense amplifier 175 discharges 820 the first input line (e.g., BL, LBL) or the second input line (e.g., BLB, LBLB), according to input signals applied to the first input line and the second input line, in a discharge phase. For example, the sense amplifier 175 may discharge 820 the first input line or the second input line, according to data stored by one or more memory cells (e.g., memory cell 125) in a discharge phase (e.g., discharge phase 350). In the discharge phase, the sense amplifier 175 may receive the pre-charge enable signal BLPREB having a second state (e.g., 1V or VDD) to disable pre-charging. In response to the pre-charge enable signal BLPREB having the second state, the pre-charge circuit (e.g., pre-charge circuit 250) can be disabled, such that the supply voltage VDD may not be applied to the first input line (e.g., BL, LBL) and the second input line (e.g., BLB, LBLB). In the pre-charge phase, the timing controller 110 may also generate a control signal to configure a multiplexer or one or more switches (e.g., transistors M10-M13) to couple one or more selected memory cells 125 to the first input line (e.g., BL, LBL) and the second input line (e.g., BLB, LBLB). Hence, according to the data stored by the one or more memory cells 125, the first input line (e.g., BL, LBL) or the second input line (e.g., BLB, LBLB) may discharge. For example, if the memory cell 125 stores a bit '0', then the second input line (e.g., BLB, LBLB) can be discharged such that the first input line (e.g., BL, LBL) may have a higher voltage than the second input line (e.g., BLB, LBLB). For example, if the memory cell 125 stores a bit '1', then the first input line (e.g., BL, LBL) can be discharged such that the second input line (e.g., BLB, LBLB) may have a higher voltage than the first input line (e.g., BL, LBL). In the pre-charge phase, the sense amplifier 175 may receive the enable signal SAE having the first state (e.g., 0V) to disable the enable transistor (e.g., transistor M6), such that the cross-coupled amplifiers (e.g., transistors M0-M3) may not perform amplification. In response to the enable signal SAE having the first state, the access transistor (e.g., transistor M4) can be enabled to apply the voltage of the first input line (e.g., BL, LBL) to a first port (e.g., DL) of the sense amplifier 175 and the access transistor (e.g., transistor M5) can be enabled to apply the voltage of the second input line (e.g., BLB, LBLB) to a second port (e.g., DLB) of the sense amplifier 175. Hence, the voltage of the first port (e.g., DL) may follow or track the voltage of the first input line (e.g., BL, LBL), and the voltage of the second port DLB may follow or track the voltage of the second input line (e.g., BLB, LBLB) in the discharge phase.

In one approach, the sense amplifier 175 amplifies 830 a difference between a first voltage of the first input line (e.g., BL, LBL) and a second voltage of the second input line (e.g., BLB, LBLB), while applying the first voltage of the first input line (e.g., BL, LBL) to a source electrode of a first transistor (e.g., M0) of the sense amplifier 175 and applying the second voltage of the second input line (e.g., BLB, LBLB) to a source electrode of a second transistor (e.g., M1) of the sense amplifier 175, in the evaluation phase (e.g., evaluation phase 380). In the evaluation phase, the sense amplifier 175 may receive the pre-charge enable signal BLPREB having the second state (e.g., 1V or VDD) to disable pre-charging. In the evaluation phase, the sense amplifier 175 may receive the enable signal SAE having the second state (e.g., 1V) to enable the enable transistor (e.g., transistor M6), such that the cross-coupled amplifiers (e.g., transistors M0-M3) may perform amplification. In response to the enable signal SAE having the second state, the access transistors (e.g., transistors M4, M5) can be disabled to electrically decouple or separate the first input line (e.g., BL, LBL) from the first port (e.g., DL) and electrically decouple or separate the second input line (e.g., BLB, LBLB) from the second port (e.g., DLB). Hence, the voltage of the first port (e.g., port DL) may not follow or track the voltage of the first input line (e.g., BL, LBL), and the voltage of the second port (e.g., port DLB) may not follow or track the voltage of the second input line (e.g., BLB, LBLB) in the evaluation phase. Meanwhile, the enable transistor (e.g., transistor M6) is enabled such that the cross-coupled amplifiers (e.g., formed by the transistors M0-M3) may detect a difference (e.g., difference 382) in voltages at the first port and the second port (e.g., DL, DLB) and amplify the difference to obtain a large voltage difference (e.g., difference 384) at the first port and the second port (e.g., DL, DLB) through a positive feedback.

In one approach, the sense amplifier 175 may provide 840 the amplified voltage difference to another circuit or a processor in the evaluation phase. The another circuit or processor may be or include a digital logic circuit. The amplified voltage difference allows the another circuit or processor to determine data represented by the input signal (e.g., data stored by the memory cell 125). After the data represented by the input signal is determined, the sense amplifier 175 may receive control signals (e.g., SAE, BLPREB) to operate in the pre-charge phase (e.g., pre-charge phase 310'), and return to the step 810 according to the control signals.

Advantageously, the sense amplifier 175 may operate with a reduced voltage offset. Assuming for an example that the first input line (e.g., BL, LBL) has a lower voltage than the second input line (e.g., BLB, LBLB) in the evaluation phase, the lower voltage of the first input line (e.g., BL, LBL) can be applied to the source electrode of the transistor M0 through the direct connection and the higher voltage of the second input line (e.g., BLB, LBLB) can be applied to the source electrode of the transistor M1 through the direct connection. Accordingly, the transistor M0 may have a negative Vsg (e.g., a difference between a voltage at the source electrode and a voltage at the gate electrode is negative), where the transistor M1 may have a positive Vsg (e.g., a difference between a voltage at the source electrode and a voltage at the gate electrode is positive). Thus, the transistor M0 can be less likely to falsely conduct than when the same voltage (e.g., supply voltage VDD) is applied to both source electrodes of the transistors M0, M1. Moreover, the cross-coupled amplifiers (e.g., formed by transistors M0-M3) may operate in a reliable manner despite PVT variations, such that the voltage offset can be reduced. Moreover, the improved reliability allows the sense amplifier 175 or transistors M0-M3 to be implemented in a smaller area.

Figure 9:
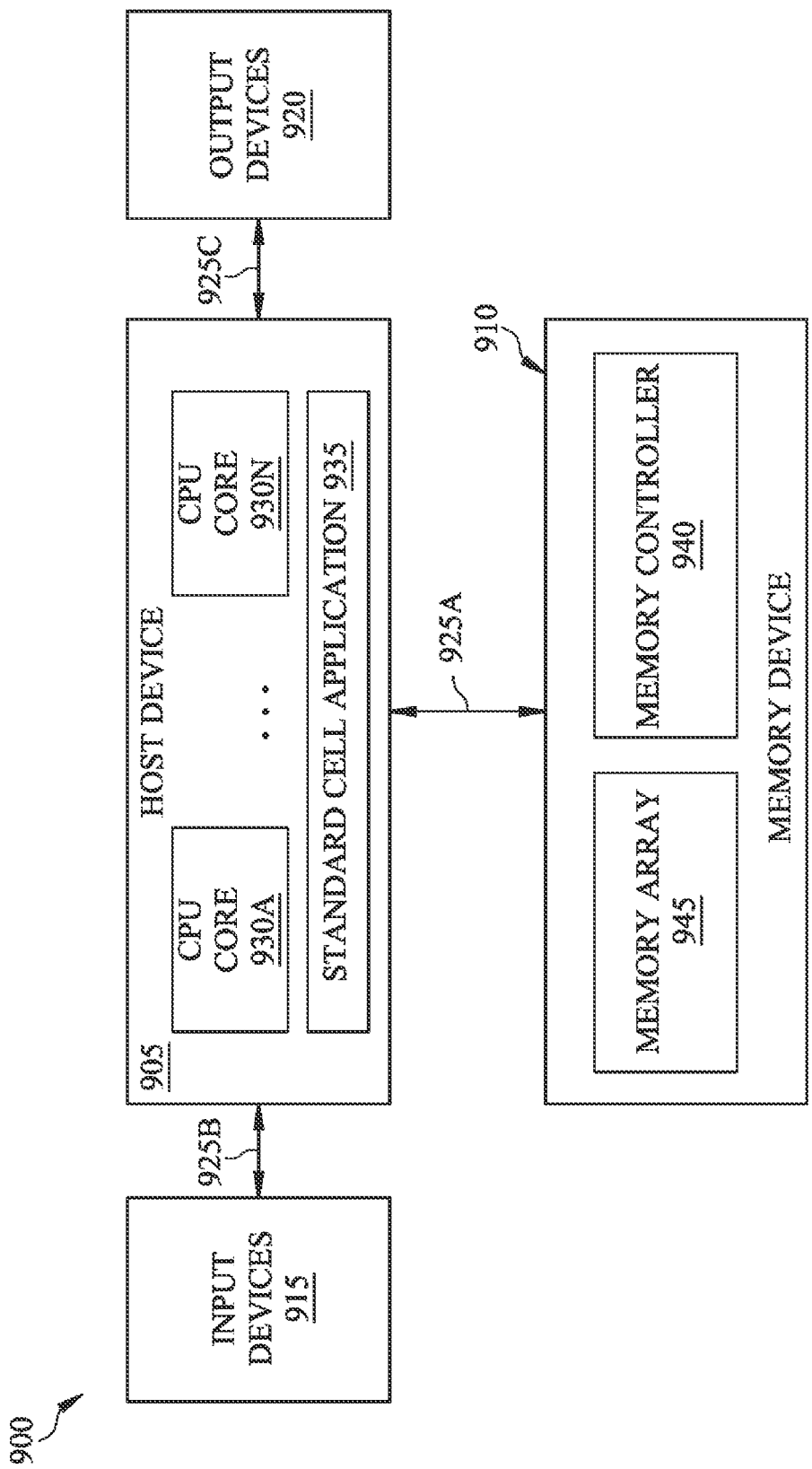
FIG. 9 is an example block diagram of a computing system, in accordance with some embodiments.

Referring now to FIG. 9, an example block diagram of a computing system 900 is shown, in accordance with some embodiments of the disclosure. The computing system 900 may be used by a circuit or layout designer for integrated circuit design. A "circuit" as used herein is an interconnection of electrical components such as resistors, transistors, switches, batteries, inductors, or other types of semiconductor devices configured for implementing a desired functionality. The computing system 900 includes a host device 905 associated with a memory device 910. The host device 905 may be configured to receive input from one or more input devices 915 and provide output to one or more output devices 920. The host device 905 may be configured to communicate with the memory device 910, the input devices 915, and the output devices 920 via appropriate interfaces 925A, 925B, and 925C, respectively. The computing system 900 may be implemented in a variety of computing devices such as computers (e.g., desktop, laptop, servers, data centers, etc.), tablets, personal digital assistants, mobile devices, other handheld or portable devices, or any other computing unit suitable for performing schematic design and/or layout design using the host device 905.

The input devices 915 may include any of a variety of input technologies such as a keyboard, stylus, touch screen, mouse, track ball, keypad, microphone, voice recognition, motion recognition, remote controllers, input ports, one or more buttons, dials, joysticks, and any other input peripheral that is associated with the host device 905 and that allows an external source, such as a user (e.g., a circuit or layout designer), to enter information (e.g., data) into the host device and send instructions to the host device. Similarly, the output devices 920 may include a variety of output technologies such as external memories, printers, speakers, displays, microphones, light emitting diodes, headphones, video devices, and any other output peripherals that are configured to receive information (e.g., data) from the host device 905. The "data" that is either input into the host device 905 and/or output from the host device may include any of a variety of textual data, circuit data, signal data, semiconductor device data, graphical data, combinations thereof, or other types of analog and/or digital data that is suitable for processing using the computing system 900.

The host device 905 includes or is associated with one or more processing units/processors, such as Central Processing Unit ("CPU") cores 930A-930N. The CPU cores 930A-930N may be implemented as an Application Specific Integrated Circuit ("ASIC"), Field Programmable Gate Array ("FPGA"), or any other type of processing unit. Each of the CPU cores 930A-930N may be configured to execute instructions for running one or more applications of the host device 905. In some embodiments, the instructions and data to run the one or more applications may be stored within the memory device 910. The host device 905 may also be configured to store the results of running the one or more applications within the memory device 910. Thus, the host device 905 may be configured to request the memory device 910 to perform a variety of operations. For example, the host device 905 may request the memory device 910 to read data, write data, update or delete data, and/or perform management or other operations. One such application that the host device 905 may be configured to run may be a standard cell application 935. The standard cell application 935 may be part of a computer aided design or electronic design automation software suite that may be used by a user of the host device 905 to use, create, or modify a standard cell of a circuit. In some embodiments, the instructions to execute or run the standard cell application 935 may be stored within the memory device 910. The standard cell application 935 may be executed by one or more of the CPU cores 930A-930N using the instructions associated with the standard cell application from the memory device 910. In one example, the standard cell application 935 allows a user to utilize pre-generated schematic and/or layout designs of the memory device 100, the sense amplifier 175, or any portion of the memory device 100 to aid integrated circuit design. After the layout design of the integrated circuit is complete, multiples of the integrated circuit, for example, including the memory device 100, the sense amplifier 175, or any portion of the memory device 100 can be fabricated according to the layout design by a fabrication facility.

Referring still to FIG. 9, the memory device 910 includes a memory controller 940 that is configured to read data from or write data to a memory array 945. The memory array 945 may include a variety of volatile and/or non-volatile memories. For example, in some embodiments, the memory array 945 may include NAND flash memory cores. In other embodiments, the memory array 945 may include NOR flash memory cores, Static Random Access Memory (SRAM) cores, Dynamic Random Access Memory (DRAM) cores, Magnetoresistive Random Access Memory (MRAM) cores, Phase Change Memory (PCM) cores, Resistive Random Access Memory (ReRAM) cores, 3D XPoint memory cores, ferroelectric random-access memory (FeRAM) cores, and other types of memory cores that are suitable for use within the memory array. The memories within the memory array 945 may be individually and independently controlled by the memory controller 940. In other words, the memory controller 940 may be configured to communicate with each memory within the memory array 945 individually and independently. By communicating with the memory array 945, the memory controller 940 may be configured to read data from or write data to the memory array in response to instructions received from the host device 905. Although shown as being part of the memory device 910, in some embodiments, the memory controller 940 may be part of the host device 905 or part of another component of the computing system 900 and associated with the memory device 910. The memory controller 940 may be implemented as a logic circuit in either software, hardware, firmware, or combination thereof to perform the functions described herein. For example, in some embodiments, the memory controller 940 may be configured to retrieve the instructions associated with the standard cell application 935 stored in the memory array 945 of the memory device 910 upon receiving a request from the host device 905.

It is to be understood that only some components of the computing system 900 are shown and described in FIG. 9. However, the computing system 900 may include other components such as various batteries and power sources, networking interfaces, routers, switches, external memory systems, controllers, etc. Generally speaking, the computing system 900 may include any of a variety of hardware, software, and/or firmware components that are needed or considered desirable in performing the functions described herein. Similarly, the host device 905, the input devices 915, the output devices 920, and the memory device 910 including the memory controller 940 and the memory array 945 may include other hardware, software, and/or firmware components that are considered necessary or desirable in performing the functions described herein.

In one aspect of the present disclosure, a sense amplifier is disclosed. In some embodiments, the sense amplifier includes a first pair of cross-coupled transistors coupled to a first port and a second port of the sense amplifier. In some embodiments, the sense amplifier includes a second pair of cross-coupled transistors coupled to the first port and the second port.

In some embodiments, the sense amplifier includes a first access transistor coupled between a first input line and the first port. In some embodiments, the sense amplifier includes a second access transistor coupled between a second input line and the second port. In some embodiments, a first transistor of the first pair of cross-coupled transistors is directly coupled to the first input line. In some embodiments, a second transistor of the first pair of cross-coupled transistors is directly coupled to the second input line.

In another aspect of the present disclosure, a memory system is disclosed. In some embodiments, the memory system includes a set of memory cells. In some embodiments, the memory system includes a bit line (BL) coupled to the set of memory cells. In some embodiments, the memory system includes a bit line bar (BLB) coupled to the set of memory cells. In some embodiments, the memory system includes a first amplifier and a second amplifier cross-coupled with each other. In some embodiments, the first amplifier is directly coupled to the BL. In some embodiments, the second amplifier is directly coupled to the BLB. In some embodiments, the memory system includes a first access transistor coupled between the BL and a first output of the first amplifier. In some embodiments, the memory system includes a second access transistor coupled between the BLB and a second output of the second amplifier.

In yet another aspect of the present disclosure, a method of amplifying an input signal by a sense amplifier is disclosed. The sense amplifier may include a first amplifier and a second amplifier cross-coupled with each other. In some embodiments, the method includes applying, through a first input line coupled to a first source electrode of a first transistor of the first amplifier, a first voltage of the first input line to the first source electrode of the first transistor, during an evaluation phase. In some embodiments, the method includes applying, through a second input line coupled to a second source electrode of a second transistor of the second amplifier, a second voltage of the second input line to the second source electrode of the second transistor, during the evaluation phase. In some embodiments, the method includes amplifying, by the first amplifier and the second amplifier, a difference between the first voltage and the second voltage, during the evaluation phase.

The term "coupled" and variations thereof includes the joining of two members directly or indirectly to one another. The term "electrically coupled" and variations thereof includes the joining of two members directly or indirectly to one another through conductive materials (e.g., metal or copper traces). Such joining may be stationary (e.g., permanent or fixed) or moveable (e.g., removable or releasable). Such joining may be achieved with the two members coupled directly with or to each other, with the two members coupled with each other using a separate intervening member and any additional intermediate members coupled with one another, or with the two members coupled with each other using an intervening member that is integrally formed as a single unitary body with one of the two members. If "coupled" or variations thereof are modified by an additional term (e.g., directly coupled), the generic definition of "coupled" provided above is modified by the plain language meaning of the additional term (e.g., "directly coupled" means the joining of two members without any separate intervening member), resulting in a narrower definition than the generic definition of "coupled" provided above. Such coupling may be mechanical, electrical, or fluidic.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A sense amplifier, comprising:
   a first pair of cross-coupled transistors coupled to a first port and a second port of the sense amplifier;
   a second pair of cross-coupled transistors coupled to the first port and the second port;
   a first access transistor coupled between a first input line and the first port;
   a second access transistor coupled between a second input line and the second port;
   an enable transistor configured to enable or disable current through the first pair of cross-coupled transistors and the second pair of cross-coupled transistors; and
   a delay circuit coupled between i) a gate electrode of the enable transistor and ii) a gate electrode of the first access transistor and a gate electrode of the second access transistor, the delay circuit configured to delay a time to disable the first access transistor and the second access transistor with respect to a time to enable the enable transistor,
wherein a first transistor of the first pair of cross-coupled transistors is directly coupled to the first input line, and
wherein a second transistor of the first pair of cross-coupled transistors is directly coupled to the second input line.

2. The sense amplifier of claim 1,
wherein a source electrode of the first transistor is directly coupled to the first input line,
wherein a source electrode of the second transistor is directly coupled to the second input line, and
wherein the source electrode of the first transistor and the source electrode of the second transistor are electrically disconnected from each other.

3. The sense amplifier of claim 2, wherein a first voltage of the first input line is applied to the source electrode of the first transistor, wherein a second voltage of the second input line is applied to the source electrode of the second transistor.

4. The sense amplifier of claim 2,
wherein the second pair of cross-coupled transistors includes a third transistor and a fourth transistor, and
wherein a source electrode of the third transistor is coupled to a source electrode of the fourth transistor.

5. The sense amplifier of claim 4,
wherein the first transistor and the second transistor are P-type transistors, and
wherein the third transistor and the fourth transistor are N-type transistors.

6. The sense amplifier of claim 4,
wherein the enable transistor is coupled to the source electrode of the third transistor and the source electrode of the fourth transistor.

7. The sense amplifier of claim 6,
wherein the first access transistor is configured to electrically decouple the first input line from the first port, during an evaluation phase,
wherein the second access transistor is configured to electrically decouple the second input line from the second port, during the evaluation phase, and
wherein the enable transistor is configured to enable the current through the first pair of cross-coupled transistors and the second pair of cross-coupled transistors during the evaluation phase.

8. The sense amplifier of claim 7, wherein a first voltage of the first input line is applied to the source electrode of the first transistor, wherein a second voltage of the second input line is applied to the source electrode of the second transistor during the evaluation phase, wherein the first voltage and the second voltage are different during the evaluation phase.

9. The sense amplifier of claim 1, further comprising:
a first switch coupled between a set of memory cells and the first input line; and
a second switch coupled between the set of memory cells and the second input line.

10. A sense amplifier, comprising:
a first pair of cross-coupled transistors coupled to a first port and a second port of the sense amplifier;
a second pair of cross-coupled transistors coupled to the first port and the second port;
a first access transistor coupled between a first input line and the first port;
a second access transistor coupled between a second input line and the second port;
a first switch coupled between a set of memory cells and the first input line;
a second switch coupled between the set of memory cells and the second input line; and
a delay circuit coupled between i) a gate electrode of an enable transistor and ii) a gate electrode of the first access transistor and a gate electrode of the second access transistor, the delay circuit configured to delay a time to disable the first access transistor and the second access transistor with respect to a time to enable the enable transistor.

11. The sense amplifier of claim 10, wherein a first transistor of the first pair of cross-coupled transistors is directly coupled to the first input line, and wherein a second transistor of the first pair of cross-coupled transistors is directly coupled to the second input line.

12. The sense amplifier of claim 11, wherein a source electrode of the first transistor is directly coupled to the first input line, and wherein a source electrode of the second transistor is directly coupled to the second input line.

13. The sense amplifier of claim 12, wherein the source electrode of the first transistor and the source electrode of the second transistor are electrically disconnected from each other.

14. The sense amplifier of claim 13, wherein the second pair of cross-coupled transistors includes a third transistor and a fourth transistor, and wherein a source electrode of the third transistor is coupled to a source electrode of the fourth transistor.

15. The sense amplifier of claim 14, wherein the first transistor and the second transistor are P-type transistors, and wherein the third transistor and the fourth transistor are N-type transistors.

16. A sense amplifier, comprising:
a first pair of cross-coupled transistors coupled to a first port and a second port of the sense amplifier;
a second pair of cross-coupled transistors coupled to the first port and the second port;
a first access transistor coupled between a first input line and the first port;
a second access transistor coupled between a second input line and the second port; and
a delay circuit coupled between i) a gate electrode of an enable transistor and ii) a gate electrode of the first access transistor and a gate electrode of the second access transistor, the delay circuit configured to delay a time to disable the first access transistor and the second access transistor with respect to a time to enable the enable transistor,
wherein a source electrode of the first transistor is directly coupled to the first input line, and wherein a source electrode of the second transistor is directly coupled to the second input line.

17. The sense amplifier of claim 16, wherein the source electrode of the first transistor and the source electrode of the second transistor are electrically disconnected from each other.

18. The sense amplifier of claim 14, wherein the enable transistor is configured to enable or disable current through the first pair of cross-coupled transistors and the second pair of cross-coupled transistors.

19. The sense amplifier of claim 15, wherein the enable transistor is coupled to the source electrode of the third transistor and the source electrode of the fourth transistor.

20. The sense amplifier of claim 16, wherein the enable transistor is configured to enable or disable current through the first pair of cross-coupled transistors and the second pair of cross-coupled transistors.

\* \* \* \* \*